United States Patent
Liu et al.

(10) Patent No.: US 10,374,034 B1
(45) Date of Patent: Aug. 6, 2019

(54) UNDERCUT CONTROL IN ISOTROPIC WET ETCH PROCESSES

(71) Applicant: International Business Machines Corporation, Armonk, NY (US)

(72) Inventors: Chi-Chun Liu, Altamont, NY (US); Muthumanickam Sankarapandian, Niskayuna, NY (US); Kristin Schmidt, Mountain View, CA (US); Ekmini Anuja De Silva, Slingerlands, NY (US); Noel Arellano, Fremont, CA (US); Robin Hsin Kuo Chao, Cohoes, NY (US); Chun Wing Yeung, Niskayuna, NY (US); Zhenxing Bi, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/985,189

(22) Filed: May 21, 2018

(51) Int. Cl.
 *H01L 29/06* (2006.01)
 *H01L 21/02* (2006.01)
 (Continued)

(52) U.S. Cl.
 CPC .... *H01L 29/0665* (2013.01); *H01L 21/02186* (2013.01); *H01L 21/02606* (2013.01);
 (Continued)

(58) Field of Classification Search
 CPC ............... H01L 29/065; H01L 29/0669; H01L 29/0676; H01L 29/66439; H01L 21/02606; B82Y 40/00
 See application file for complete search history.

(56) References Cited

U.S. PATENT DOCUMENTS

| 7,767,386 B2 | 8/2010 | Dunn |
| 7,790,350 B2 | 9/2010 | Breyta et al. |

(Continued)

FOREIGN PATENT DOCUMENTS

| CN | 1295343 A | 5/2001 |
| CN | 101120433 A | 2/2008 |

(Continued)

OTHER PUBLICATIONS

R.A. Farrell et al., "Large-Scale Parallel Arrays of Silicon Nanowires via Block Copolymer Directed Self Assembly," Nanoscale, May 21, 2012, pp. 3228-3236, vol. 4, No. 10.

(Continued)

*Primary Examiner* — Joseph C. Nicely
(74) *Attorney, Agent, or Firm* — Vazken Alexanian; Ryan, Mason & Lewis, LLP (57) ABSTRACT

A method for manufacturing a semiconductor device includes forming a first nanosheet device and forming a second nanosheet device spaced apart from the first nanosheet device in respective first and second regions corresponding to first and second types. The first and second nanosheet devices respectively include a first and a second plurality of work function metal layers, and a work function metal layer extends from the first and second plurality of work function metal layers in the space between the nanosheet devices. In the method, part of the work function metal layer is removed from the space between the nanosheet devices, and the removed part of the work function metal layer is replaced with a polymer brush layer. The first plurality of work function metal layers is selectively removed from the first region with respect to the polymer brush layer.

20 Claims, 8 Drawing Sheets

(51) Int. Cl.
*H01L 29/66* (2006.01)
*B82Y 40/00* (2011.01)

(52) U.S. Cl.
CPC ...... *H01L 29/0669* (2013.01); *H01L 29/0676* (2013.01); *H01L 29/66439* (2013.01); *B82Y 40/00* (2013.01)

(56) References Cited

U.S. PATENT DOCUMENTS

| | | | |
|---|---|---|---|
| 8,753,942 | B2 | 6/2014 | Kuhn et al. |
| 9,093,260 | B2 | 7/2015 | Adam et al. |
| 9,331,146 | B2 | 5/2016 | Chen et al. |
| 9,388,268 | B2 | 7/2016 | Gopalan et al. |
| 9,484,267 | B1* | 11/2016 | Cheng ............... H01L 21/82382 |
| 9,923,055 | B1* | 3/2018 | Cheng ................. H01L 29/0665 |
| 10,074,575 | B1* | 9/2018 | Guillorn ............. H01L 29/0673 |
| 2003/0129531 | A1 | 7/2003 | Oberlander et al. |
| 2009/0098490 | A1 | 4/2009 | Pham et al. |
| 2012/0092279 | A1 | 4/2012 | Martin |
| 2013/0127021 | A1 | 5/2013 | Millward |
| 2014/0001441 | A1* | 1/2014 | Kim .................... H01L 29/0673 257/29 |
| 2015/0024597 | A1 | 1/2015 | Gao et al. |
| 2017/0117359 | A1* | 4/2017 | Cheng ............... H01L 21/76213 |

FOREIGN PATENT DOCUMENTS

| | | |
|---|---|---|
| CN | 101449405 A | 6/2009 |
| CN | 105374773 A | 3/2016 |
| WO | 2014146937 A2 | 9/2014 |

OTHER PUBLICATIONS

P. Mansky et al., "Controlling Polymer-Surface Interactions with Random Copolymer Brushes," Science, Mar. 7, 1997, pp. 1458-1460, vol. 275, No. 5305.

* cited by examiner

UNDERCUT CONTROL IN ISOTROPIC WET ETCH PROCESSES

BACKGROUND

Nanosheet devices can be viable device options instead of fin field-effect transistors (FinFETs). For example, nanowires or nanosheets can be used as the fin structure in a dual-gate, tri-gate or gate-all-around (GAA) FET device. Complementary metal-oxide semiconductor (CMOS) scaling can be enabled by the use of stacked nanowires and nanosheets, which offer superior electrostatics and higher current density per footprint area than FinFETs. Additionally, nanosheet devices are being pursued as a viable device option for the 5 nm node and beyond. Nanosheet formation relies on the selective removal of one semiconductor (e.g., SiGe) with respect to another (e.g. Si) to form the nanosheet and GAA structures.

Work function metal (WFM) removal in nanosheet processing requires extensive over-etching to remove WFM layers in between nanosheets. Similar process requirements can exist for defining dual WFM, and multi-threshold voltage (Vt) devices.

Conventional lateral etch processes limit the minimum distance between n-type metal-oxide semiconductor (NMOS) and p-type metal-oxide semiconductor (PMOS) nanosheet devices, and limit the width of nanosheets. Due to increased device density being employed in many applications, reduced distance between n-type and p-type nanosheet devices is required. Accordingly, there is a need for improved WFM removal in nanosheet processing which allows for reduction of the distance between n-type and p-type nanosheet devices.

SUMMARY

According to an exemplary embodiment of the present invention, a method for manufacturing a semiconductor device includes forming a first nanosheet device in a first region corresponding to a first type, and forming a second nanosheet device spaced apart from the first nanosheet device in a second region corresponding to a second type. The first and second nanosheet devices respectively include a first plurality of work function metal layers, and a second plurality of work function metal layers. A work function metal layer extends from the first and second plurality of work function metal layers in the space between the first and second nanosheet devices. The method further includes forming an organic planarization layer (OPL) in the second region. The OPL covers the second nanosheet device and a first part of the work function metal layer in the space between the first and second nanosheet devices. A second part of the work function metal layer not covered by the OPL is removed from the space between the first and second nanosheet devices, and a portion of the first part of the work function metal layer is removed from under the organic planarization layer. In the method, removed areas of the work function metal layer are replaced with a polymer brush layer, and the first plurality of work function metal layers is selectively removed from the first region with respect to the polymer brush layer.

According to an exemplary embodiment of the present invention, a method for manufacturing a semiconductor device includes forming a first stacked transistor device in a first region corresponding to a first type, and forming a second stacked transistor device spaced apart from the first stacked transistor device in a second region corresponding to a second type. The first and second stacked transistor devices respectively include a first and a second plurality of work function metal layers, and a work function metal layer extends from the first and second plurality of work function metal layers in the space between the first and second stacked transistor devices. The method further includes depositing a mask layer to cover the second stacked transistor device and portions adjacent the second stacked transistor device in the second region. In the method, part of the work function metal layer is removed from the space between the first and second stacked transistor devices, and the removed part of the work function metal layer is replaced with a polymer brush layer. The first plurality of work function metal layers is selectively removed from the first region with respect to the polymer brush layer.

According to an exemplary embodiment of the present invention, a method for manufacturing a semiconductor device includes forming a first plurality of stacked channel portions in a first region corresponding to a first type, and forming a second plurality of stacked channel portions spaced apart from the first plurality of stacked channel portions in a second region corresponding to a second type. The first plurality of stacked channel portions are alternatingly stacked with a first plurality of work function metal layers, and the second plurality of stacked channel portions are alternatingly stacked with a second plurality of work function metal layers. A work function metal layer extends from the first and second plurality of work function metal layers in the space between the first and second plurality of stacked channel portions. The method further includes forming an organic planarization layer (OPL) in the second region. The OPL covers the second plurality of stacked channel portions and a first part of the work function metal layer in the space between the first and second plurality of stacked channel portions. In the method, a second part of the work function metal layer not covered by the organic planarization layer is removed from the space between the first and second plurality of stacked channel portions, and a portion of the first part of the work function metal layer under the organic planarization layer is also removed. The removed areas of the work function metal layer are replaced with a polymer brush layer, and the first plurality of work function metal layers is selectively removed from the first region with respect to the polymer brush layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to using a polymer brush layer as a mask to prevent lateral removal of WFM portions in between nanosheet devices.

It is to be understood that the various layers and/or regions shown in the accompanying drawings are not drawn to scale, and that one or more layers and/or regions of a type commonly used in, for example, complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, CMOSs, MOSFETs, nanowire FETs, nanosheet FETs and/or FinFETs. By way of non-limiting example, the semiconductor devices can include, but are not limited to FET, CMOS, MOSFET, nanowire FET, nanosheet FET and FinFET devices, and/or semiconductor devices that use FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention relate to methods and structures wherein a selectively formed polymer brush layer is used to prevent removal of WFM portions in between nanosheet devices. More specifically, in accordance with an embodiment of the present invention, a polymer brush layer blocks removal of a WFM region between nanosheet devices having different device types (e.g., n-type and p-type) during removal of WFM layers from a first one of the nanosheet devices. Portions of the polymer brush layer are positioned under a mask layer (e.g., an organic planarization layer (OPL)) covering a second one of the nanosheet devices. As a result, the polymer brush layer prevents etching chemicals from reaching and undercutting the WFM under the mask layer (e.g., OPL). By preventing removal of WFM portions in between nanosheet devices, the embodiments of the present invention eliminate a need to compensate for excess WFM removal between devices. Accordingly, narrower WFM regions can be formed between nanosheet devices, thereby decreasing distance between nanosheet devices and increasing device density.

Although embodiments of the present invention are discussed in connection with nanosheet stacks, the embodiments of the present invention are not necessarily limited thereto, and may similarly apply to nanowire stacks.

Figure 1:
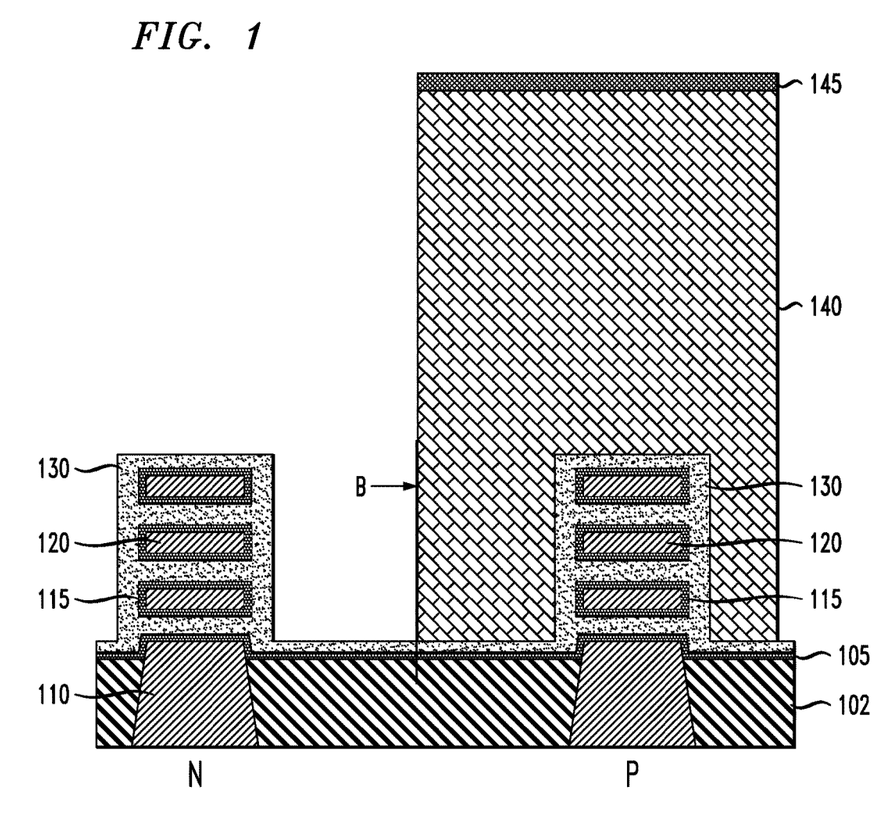
FIG. 1 is a schematic cross-sectional view illustrating manufacturing of a semiconductor device and showing formation of an organic planarization layer (OPL) on a p-type region of a nanosheet device, according to an embodiment of the invention.

FIG. 1 is a schematic cross-sectional view illustrating manufacturing of a semiconductor device and showing formation of an organic planarization layer (OPL) on a p-type region of a nanosheet device, according to an embodiment of the invention. Referring to FIG. 1, two opposite type nanosheet devices N and P (e.g., n-type and p-type) are formed spaced apart from each other. In accordance with an embodiment of the present invention, whether the devices are n-type or p-type is controlled by work function metal (WFM) selection as discussed further herein in connection with FIG. 7.

Each device includes a plurality of channel portions 120 in an alternating stacked configuration with WFM regions 130. The WFM regions 130 include WFM layers formed in the alternating stacked configuration with the channel portions 120 for each of the nanosheet devices N and P, WFM layers formed on sides of the stacked channel portions 120 and a WFM layer formed in between the opposite type nanosheet devices N and P. Each channel portion 120 is surrounded by a high-k dielectric layer 115 positioned between the WFM layers and the corresponding channel portion 120.

The nanosheet devices N and P further include lower channel portions 110 under the stacked configuration of the channel portions 120 alternating with the WFM regions 130. The lower channel portions are surrounded by a dielectric layer 102 including a high-k dielectric layer 105 formed on the dielectric layer 102 and on upper surfaces of each of the lower channel portions 110. A boundary B between regions corresponding to different types (e.g., n-type and p-type) is shown by a vertical line between n-type and p-type regions. In accordance with an embodiment of the present invention, the illustrated nanosheet devices N and P correspond to n-type and p-type devices, respectively. However, the embodiments of the present invention are not necessarily limited thereto, and may correspond to p-type and n-type devices, respectively. The nanosheet devices N and P, including the lower channel portions 110, the stacked configuration of the channel portions 120 alternating with the WFM regions 130, and the dielectric layers 105 and 115, are formed by processes for forming nanosheet and/or nanowire devices known to those of ordinary skill on the art.

In accordance with an embodiment of the present invention, the channel portions 120 and 110 comprise semiconductor material including, but not necessarily limited to, silicon (Si), silicon germanium (SiGe), III-V, II-V compound semiconductor or other like semiconductor. While three channel portions 120 are shown, the embodiments of the present invention are not necessarily limited to the shown number of channel portions 120, and there may be more or less layers in the same alternating configuration with the WFM regions 130 depending on design constraints. In a non-limiting example, a height of the channel portions 120 can be in the range of about 6 nm-about 15 nm depending on the desired process and application. In accordance with an embodiment of the present invention, each of the channel portions 120 has the same or substantially the same composition and size as each other.

The WFM regions 130 include but are not necessarily limited to, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN. The high-K dielectric layers 115 and 105 include, but are not necessarily limited to, $HfO_x$ (hafnium oxide (e.g., $HfO_2$)), $ZrO_2$ (zirconium dioxide), hafnium zirconium oxide, $Al_2O_3$ (aluminum oxide), and $Ta_2O_5$ (tantalum V oxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

In accordance with an embodiment of the present invention, the dielectric layer 102 comprises, but is not necessarily limited to, silicon oxide ($SiO_x$), where x is, for example, 1.99, 2, 2.01), low-temperature oxide (LTO), high-temperature oxide (HTO), flowable oxide (FOX) or some other dielectric. According to an embodiment of the present invention, the dielectric layer 102 and channel portions 110 are formed on a semiconductor substrate (not shown). The semiconductor substrate may comprise semiconductor material including, but not necessarily limited to, Si, SiGe, III-V, II-V compound semiconductor or other like semiconductor.

An OPL 140 is formed on the nanosheet device P, and on portions of WFM regions 130 adjacent the nanosheet device P. An oxide layer 145 is formed on the OPL 140. The OPL comprises, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL 140 can be deposited, for example, by spin coating. The oxide layer 145 comprises, but is not necessarily limited to, titanium oxide (TiOx), $SiO_x$ and silicon-containing anti-reflection coating (SiARC).

Figure 2:
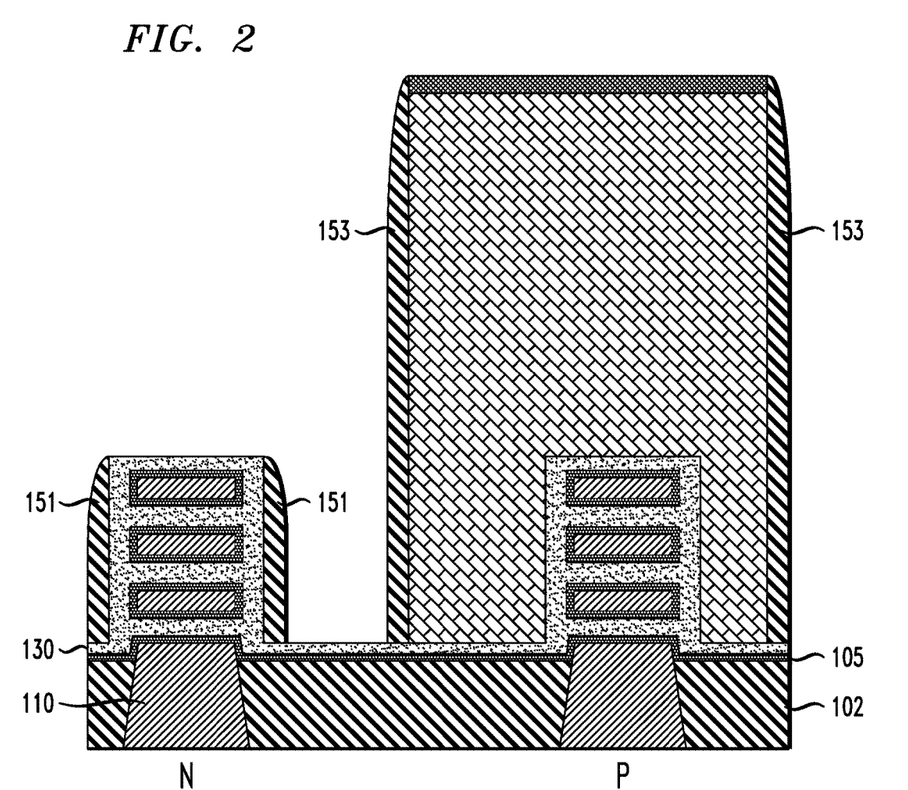
FIG. 2 is a schematic cross-sectional view illustrating manufacturing of a semiconductor device and showing spacer formation, according to an embodiment of the invention.

FIG. 2 is a schematic cross-sectional view illustrating manufacturing of a semiconductor device and showing spacer formation, according to an embodiment of the invention. Referring to FIG. 2, first spacers 151 are formed on sides of the nanosheet device N and second spacers 153 are formed on sides of the OPL and oxide layers 140 and 145. The first and second spacer layers 151 and 153 can be deposited using an IRad® (in-situ radical assisted deposition) tool commercially available from Tokyo Electron Laboratory (TEL). The first and second spacer layers 151 and 153 may be about 2 nm to about 6 nm thick, but could also be thinner or thicker. Alternatively, the spacers can be deposited by one or more deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating.

The material of the spacer layers 151 and 153 can comprise for example, an oxide, such as, for example, silicon oxide ($SiO_x$).

As explained in more detail herein, the first and second spacer layers 151 and 153 preserve the surface areas of covered WFM regions 130 from brush grafting in subsequent steps.

Figure 3:
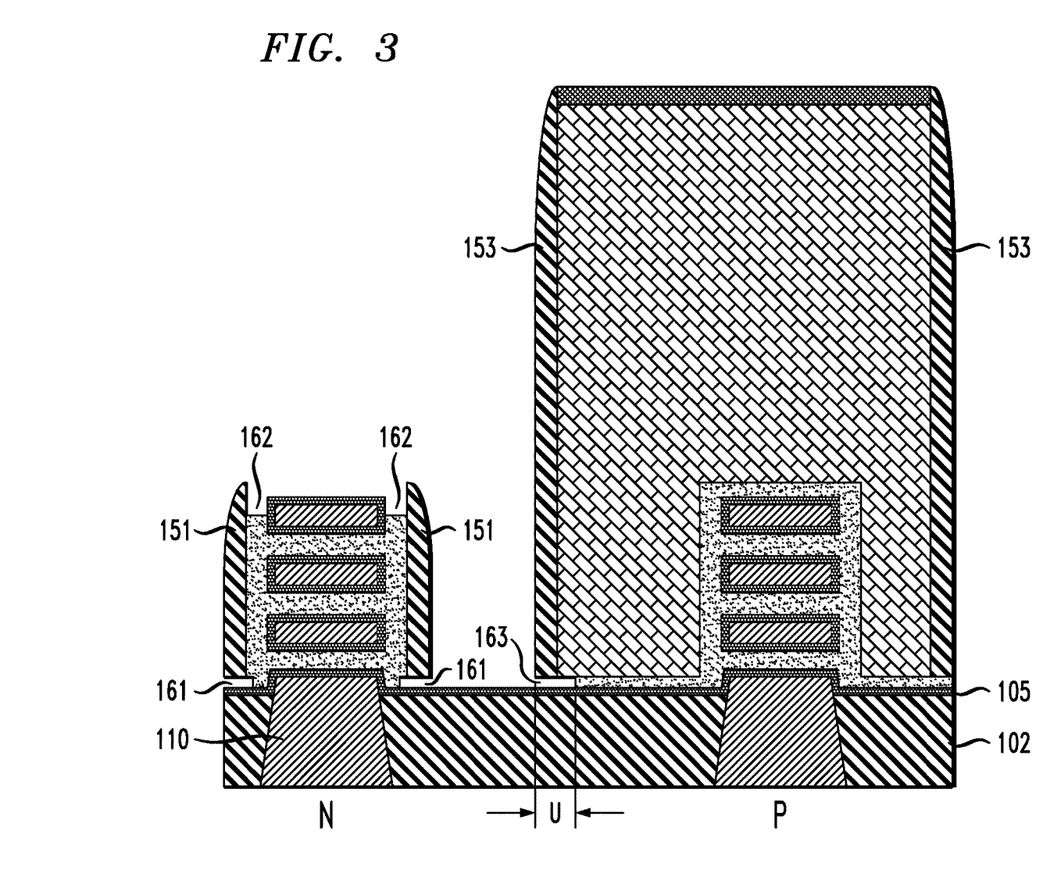
FIG. 3 is a schematic cross-sectional view illustrating manufacturing of a semiconductor device and showing removal of portions of work function metal regions, according to an embodiment of the invention.

FIG. 3 is a schematic cross-sectional view illustrating manufacturing of a semiconductor device and showing removal of portions of work function metal regions, according to an embodiment of the invention. Referring to FIG. 3, portions of the WFM regions 130 are removed from the nanosheet devices N and P and from between the nanosheet devices N and P. As shown in FIG. 3, the removal exposes portions of the high-k dielectric layer 115 around an uppermost channel portion 120 of the N nanosheet device to form vacancies 162. The removal also exposes a portion of the high-k dielectric layer 105 between the nanosheet devices N and P. In addition, removal of portions of the WFM regions 130 extends to under the first spacers 151 and under one of the second spacers 153 and part of the OPL 140 to form vacancies 161 and 163, which undercut the first spacers 151, the second spacer 153 and part of the OPL 140. According to an embodiment of the present invention, the undercut U corresponding to vacancy 163 is about 2 nm-about 3 nm more than the spacer thickness. For example, assuming a spacer thickness of 5 nm, the undercut U corresponding to vacancy 163 is about 7 nm-about 8 nm.

As noted in connection with FIG. 2, the first and second spacer layers 151 and 153 can be deposited using an IRad® tool and can comprise for example, an oxide, such as, for example, silicon oxide ($SiO_x$). In accordance with an embodiment of the present invention, IRad® oxide (e.g., the material of the spacers 151 and 153) has a very low etch rate in room temperature SC1 ($NH_4OH:H_2O_2:H_2O$) (RT SC1) when compared with a material of the WFM regions 130 (e.g., TiN). For example, TiN/SiOx selectivity in RT SC1 is >100 times. Therefore, as a result of etching with RT SC1, the exposed portions of the WFM regions 130 can be removed to expose portions of the dielectric layers 105 and 115, and undercuts can be formed to create the vacancies 161, 162 and 163, while removing very small amounts (e.g., 100 times less) of the spacer layers 151 and 153.

Figure 4:
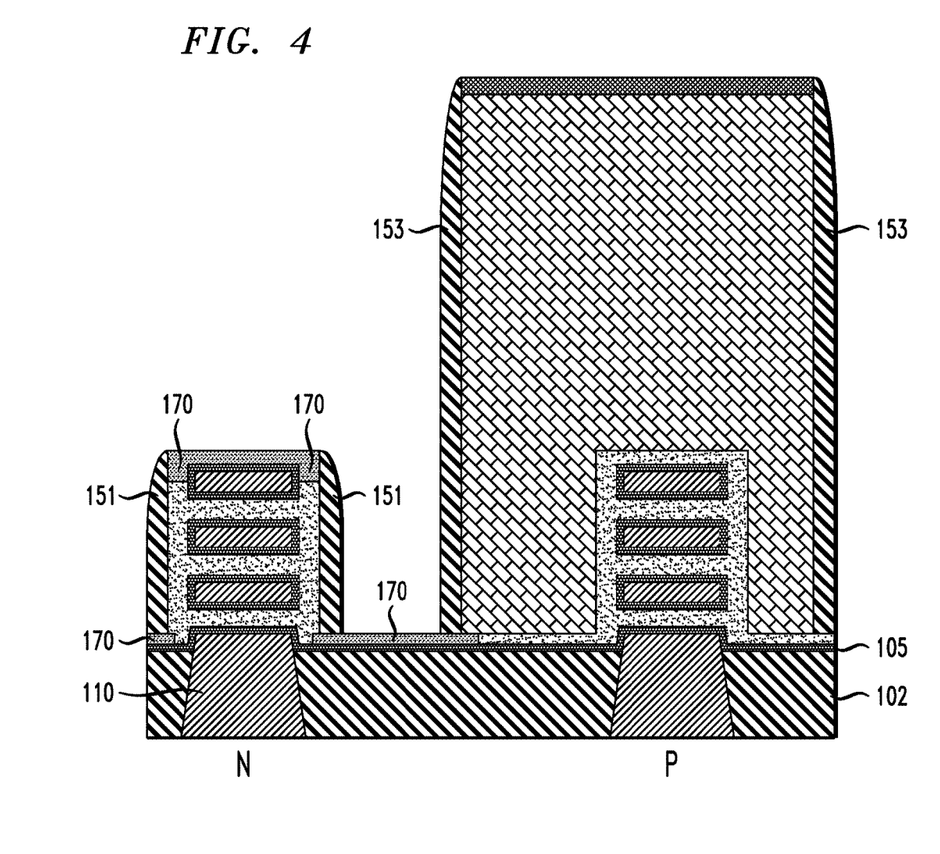
FIG. 4 is a schematic cross-sectional view illustrating manufacturing of a semiconductor device and showing selective polymer brush formation on exposed work function metal regions and high-k dielectric regions, according to an embodiment of the invention.

FIG. 4 is a schematic cross-sectional view illustrating manufacturing of a semiconductor device and showing selective polymer brush formation on exposed work function metal regions and high-k dielectric regions, according to an embodiment of the invention. Referring to FIG. 4, polymer brush layers 170 are selectively formed on exposed WFM regions 130 and high-k dielectric layers 115 and 105, including in the vacant areas 161, 162 and 163. As shown in FIG. 4, the polymer brush layers 170 replace the removed WFM regions 130 removal during the processing discussed in connection with FIG. 3, and fill-in the areas undercutting the spacers 151 and 153 and the OPL 140.

In accordance with an embodiment of the present invention, the deposited polymer brush material has faster grafting kinetics on the WFM regions 130 (e.g., TiN) and on the high-k dielectric layers 105, 115 (e.g., $HfO_x$) than on the OPL 140 and spacer layers 151, 153 (e.g., $SiO_x$). According to an embodiment of the present invention, a process (e.g., annealing) temperature (e.g., about 120° C.-about 140° C.) is used which will provide almost full coverage of the polymer brush layer 170 on the WFM regions 130 (e.g., TiN) and on the high-k dielectric layers 105, 115 (e.g., $HfO_x$), while the OPL 140 and spacer layers 151, 153 (e.g., $SiO_x$) remain mostly uncovered. As can be seen in FIG. 4, the high-k dielectric layer 105 in the area between the N and P nanosheet devices are protected by a polymer brush layer 170. According to an embodiment of the present invention, the polymer brush layers 170 include, but are not necessarily limited to, polystyrene, polytetrafluoroethylene (PTFE), polyimide, and polypropylene, and have a vertical height/thickness of about 3 nm to about 10 nm.

Figure 5A:
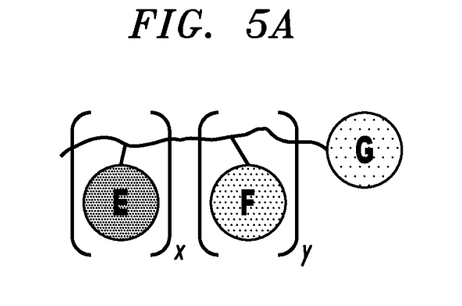
FIG. 5A is a schematic diagram illustrating a structure of a polymer brush material, according to an embodiment of the invention.
Figure 5B:
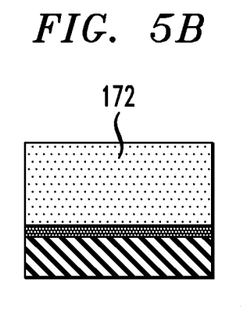
FIG. 5B is a schematic cross-sectional view illustrating part of a process for polymer brush grafting, according to an embodiment of the invention.
Figure 5C:
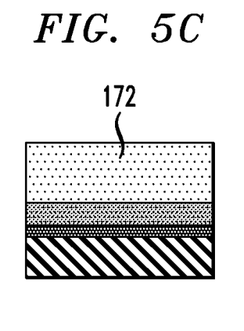
FIG. 5C is a schematic cross-sectional view illustrating part of a process for polymer brush grafting, according to an embodiment of the invention.
Figure 5D:
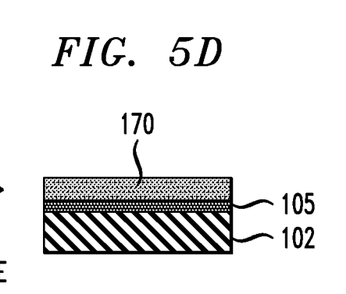
FIG. 5D is a schematic cross-sectional view illustrating part of a process for polymer brush grafting, according to an embodiment of the invention.

FIG. 5A is a schematic diagram illustrating a structure of a polymer brush material, and FIGS. 5B, 5C and 5D are schematic cross-sectional views illustrating polymer brush grafting, according to an embodiment of the invention. Referring to FIG. 5A, a polymer brush material, according to an embodiment of the present invention, is a random copolymer of two (or more) components E and F with a functional group G at one end. Components E and F can be used for surface energy control and end group G is for surface binding. Additional components can be added onto the side chain to control grafting behavior, surface properties, etch behavior, n/k value, etc.

The application of the polymer brush layers 170 (also referred to as "grafting" herein) is self-limiting, i.e., only 1 mono-layer of polymer will be grafted because there is only one grafting group per chain. Process temperature, grafting density, kinetics, surface selectivity can be optimized by choosing a proper grafting group (e.g., group G). For example, as noted above, a polymer brush is used that grafts faster on the WFM regions 130 (e.g., TiN) and on the high-k dielectric layers 105, 115 (e.g., $HfO_x$) than on the OPL 140 and spacer layers 151, 153 (e.g., $SiO_x$) at certain temperatures. In other words, a polymer brush material is used which selectively reacts with the WFM regions 130 and the high-k dielectric layers 105, 115. A vertical height/thickness of the resulting polymer brush layer 170 depends on, for example, polymer chain length and grafting time. In a non-limiting example, a polymer brush layer 170 having a vertical height/thickness of about 3 nm to about 10 nm may be grafted for about 5 minutes.

Referring to FIG. 5B, in a non-limiting illustrative example, the polymer brush material as-cast 172 is shown as being deposited on high-k dielectric layer 105, which is on the dielectric layer 102. The polymer brush material as-cast 172 can be deposited using, for example, a spin-on coating process, and may have a vertical height/thickness of, for example, about 30 nm to about 50 nm. Referring to FIG. 5C, an annealing process is performed, for example, at about 120° C.-about 140° C., to react a mono-layer of the polymer with the underlying high-k dielectric layer 105 (or WFM region 130) to result in the polymer brush layer 170. An ungrafted portion of the brush as-cast 172 remains on the polymer brush layer 170 in FIG. 5C. Then, referring to FIG. 5D, the solvent used for the polymer brush (e.g., $H_2O$) is used to rinse off the ungrafted portion of the brush as-cast 172, leaving the remaining polymer brush layer 170, which is covalently bonded to the underlying layer.

Figure 6:
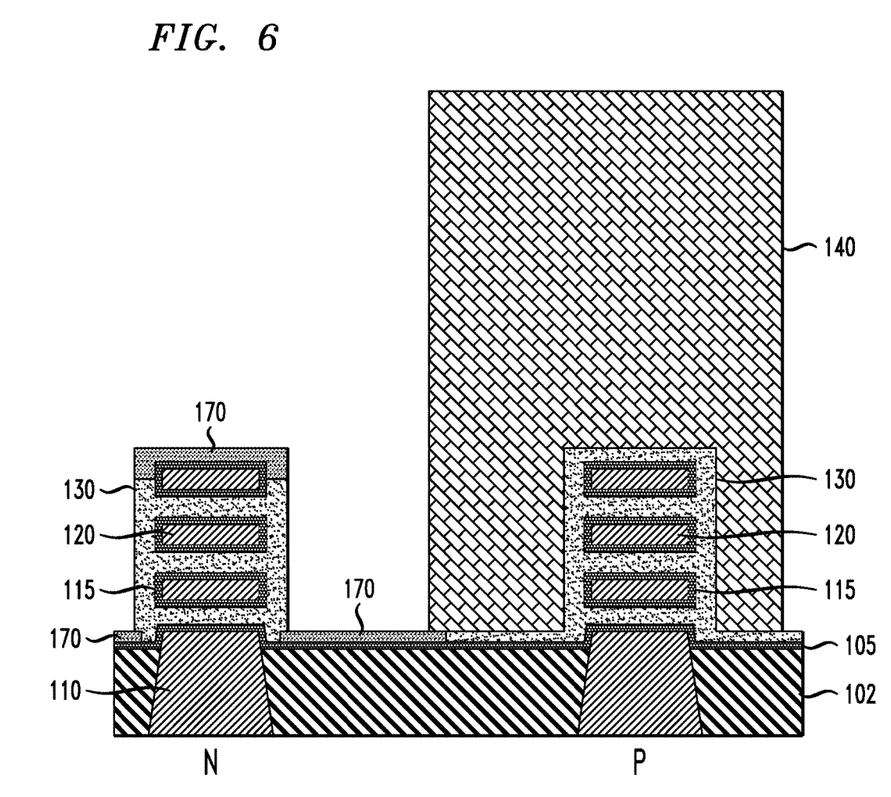
FIG. 6 is a schematic cross-sectional view illustrating manufacturing of a semiconductor device and showing spacer removal, according to an embodiment of the invention.

FIG. 6 is a schematic cross-sectional view illustrating manufacturing of a semiconductor device and showing spacer removal, according to an embodiment of the invention. Referring to FIG. 6, the first and second spacer layers 151 and 153 are removed using an etchant which has a high selectivity between the spacer material (e.g., $SiO_x$) and the high-k dielectric material (e.g., $HfO_x$) so as to minimize the risk of high-k damage. For example, an etchant which has a high $SiO_x/HfO_x$ selectivity is used to prevent damage to the high-k layers 105, 115 if coverage of the polymer brush layers 170 is insufficient.

In accordance with an embodiment of the present invention, a SiCoNi® etch is used to remove the spacers 151, 153.

SiCoNi® etch is a remote plasma assisted dry etch process, where a substrate is simultaneously exposed to $H_2$, $NF_3$ and $NH_3$ plasma by-products. A SiCoNi® etch has >200:1 $SiO_x$ to $HfO_x$ selectivity and no impact on surface roughness. Alternatively, a chemical oxide removal (COR) process, which also has a high $SiO_x/HfO_x$ selectivity, can be used. In another alternative, dilute hydrofluoric acid (DHF) or vapor HF can be used to remove the spacer layers 151 and 153. As can be seen in FIG. 6, in addition to removing the spacer layers 151 and 153, the etching described in connection with FIG. 6 also selectively removes the oxide layer 145 with respect to the underlying OPL 140.

Figure 7:
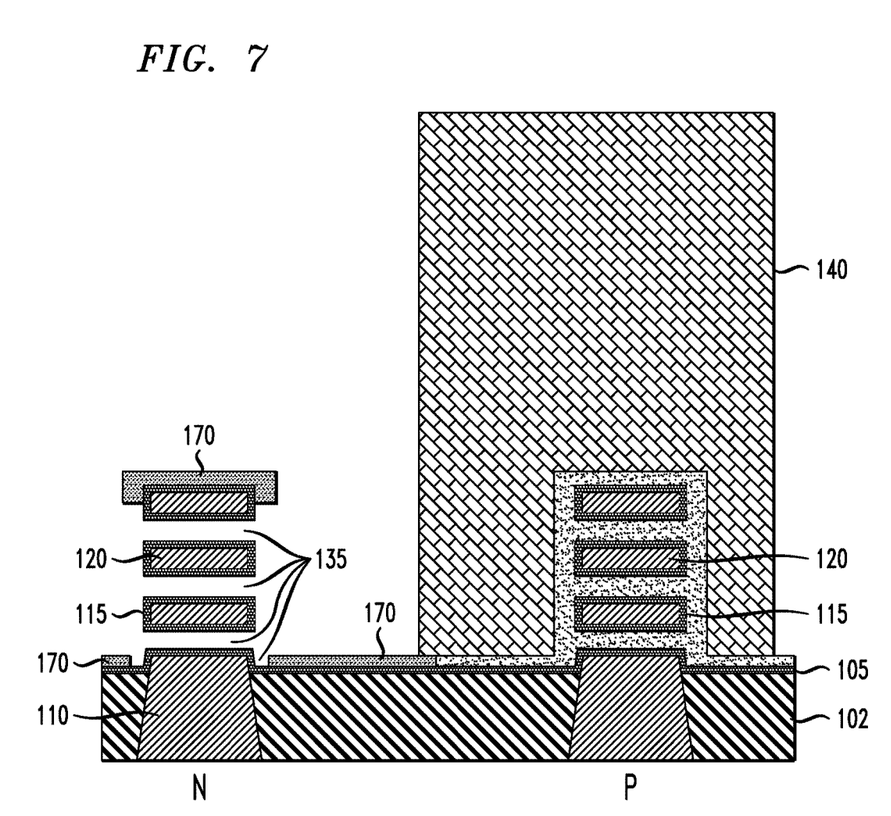
FIG. 7 is a schematic cross-sectional view illustrating manufacturing of a semiconductor device and showing removal of exposed portions of work function metal regions from an n-type region of a nanosheet device, according to an embodiment of the invention.

FIG. 7 is a schematic cross-sectional view illustrating manufacturing of a semiconductor device and showing removal of exposed portions of work function metal regions from an n-type region of a nanosheet device, according to an embodiment of the invention. Referring to FIG. 7, using, for example, an etching process with RT SC1, the exposed WFM regions 130 are selectively removed from the nanosheet device N with respect to the remaining polymer brush layers 170 and the high-k dielectric layers 105, 115 to create vacant regions 135 where a different WFM than that in the p-type region can be deposited. The WFM to be added to the n-type region is selected to result in an n-type device. The WFM regions 130 corresponding to the nanosheet device P in the p-type region are well protected by the polymer brush layer 170 and the OPL 140 so that extended WFM over-etching can be employed to remove the exposed surfaces of the WFM region 130 in the n-type region.

Figure 8:
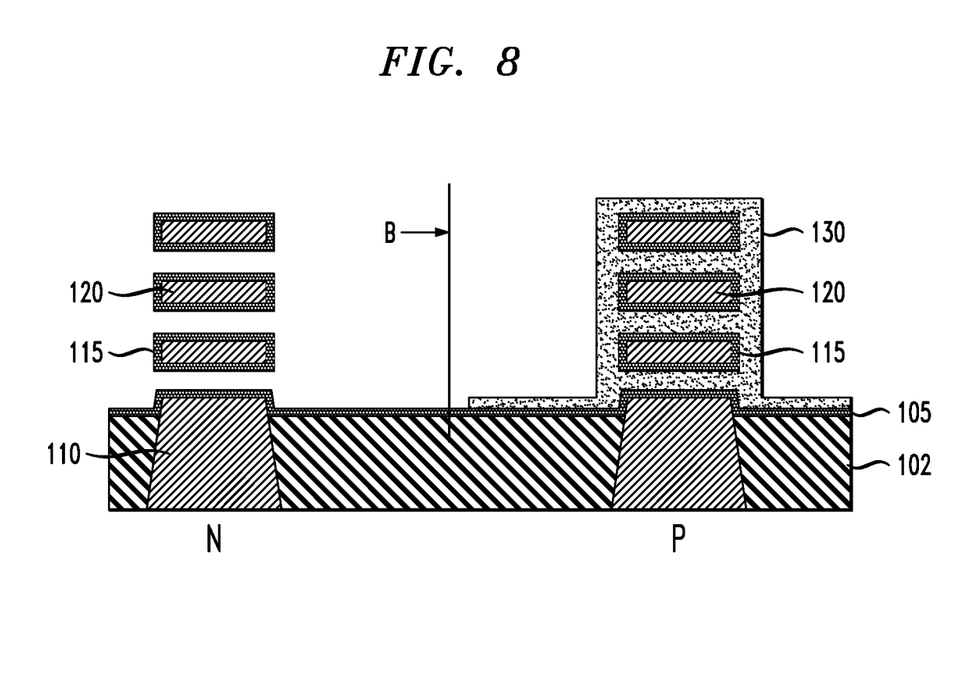
FIG. 8 is a schematic cross-sectional view illustrating manufacturing of a semiconductor device and showing organic planarization layer (OPL) and polymer brush removal, according to an embodiment of the invention.

FIG. 8 is a schematic cross-sectional view illustrating manufacturing of a semiconductor device and showing organic planarization layer (OPL) and polymer brush removal, according to an embodiment of the invention. Referring to FIG. 8, the polymer brush layer 170, which, according to an embodiment of the present invention, is a carbon-based polymer, is removed together with the OPL 140. The OPL 140 and the polymer brush layer 170 are stripped using, for example, oxygen plasma, nitrogen plasma, hydrogen plasma or other carbon strip or ashing process. The stripping process causes minimal or no damage to the remaining layers. As can be seen in FIG. 8, the polymer brush layer 170 is removed from the n-type region, where a different WFM than the WFM 130 in the p-type region can be deposited.

Notably, referring to the boundary B between regions corresponding to different type devices (e.g., n-type and p-type), as a result of the processing described herein, including the use of the polymer brush layer 170 filling in an undercut portion beneath the OPL 140 and second spacer layer 153 in a p-type region as described in connection with FIG. 4, minimum WFM (e.g., TiN) lateral etching between opposite type regions is achieved. As noted herein above in connection with FIG. 3, the undercut U corresponding to vacancy 163 is about 2 nm-about 3 nm more than the spacer thickness, such that a sufficiently small amount of WFM between the nanosheet devices N and P is removed. As a result, due to the lateral etch control provided by the embodiments of the present invention, the distance between n-type and p-type nanosheet devices can be reduced, while still permitting WFM removal from one of the opposite type regions. In accordance with a non-limiting embodiment of the present invention, a distance between n-type and p-type nanosheet devices (e.g., nanosheet devices N and P) is in the range of about 20 nm to about 60 nm based on design constraints.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

The invention claimed is:

1. A method for manufacturing a semiconductor device, comprising:
    forming a first nanosheet device in a first region corresponding to a first type, wherein the first nanosheet device comprises a first plurality of work function metal layers;
    forming a second nanosheet device spaced apart from the first nanosheet device in a second region corresponding to a second type, wherein the second nanosheet device comprises a second plurality of work function metal layers, and wherein a work function metal layer extends from the first and second plurality of work function metal layers to a space between the first and second nanosheet devices;
    forming an organic planarization layer in the second region covering the second nanosheet device and a first part of the work function metal layer in the space between the first and second nanosheet devices;
    removing a second part of the work function metal layer not covered by the organic planarization layer from the space between the first and second nanosheet devices;
    removing a portion of the first part of the work function metal layer under the organic planarization layer;
    replacing removed areas of the work function metal layer with a polymer brush layer; and
    selectively removing the first plurality of work function metal layers with respect to the polymer brush layer from the first region.

2. The method according to claim 1, further comprising:
    forming a first spacer layer on the first plurality of work function metal layers; and
    forming a second spacer layer on the organic planarization layer.

3. The method according to claim 2, wherein the first and second spacer layers comprise silicon oxide.

4. The method according to claim 2, wherein a portion of the second part of the work function metal layer is removed from under the second spacer layer.

5. The method according to claim 2, wherein a portion of the second part of the work function metal layer is removed from under the first spacer layer.

6. The method according to claim 2, further comprising selectively removing the first and second spacer layers with respect to the polymer brush layer.

7. The method according to claim 2, wherein a high-k dielectric layer is formed under the work function metal layer.

8. The method according to claim 7, wherein replacing the removed areas of the work function metal layer with the polymer brush layer comprises selectively forming the polymer brush layer on the high-k dielectric layer.

9. The method according to claim 7, wherein a material of the polymer brush layer grafts at a faster rate on the high-k dielectric layer than on the first and second spacer layers.

10. The method according to claim 7, wherein a material of the polymer brush layer grafts at a faster rate on the high-k dielectric layer than on the organic planarization layer.

11. The method according to claim 1, wherein replacing the removed areas of the work function metal layer with a polymer brush layer comprises performing an annealing process at a temperature in the range of about 120° C. to about 140° C.

12. The method according to claim 1, further comprising:
removing part of the first plurality of work function metal layers from an upper portion of the first nanosheet device;
replacing the removed part of the first plurality of work function metal layers with another polymer brush layer.

13. The method according to claim 1, further comprising removing the organic planarization layer and the polymer brush layer during the same removal process.

14. The method according to claim 1, wherein the polymer brush layer comprises at least one of polystyrene, polytetrafluoroethylene, polyimide and polypropylene.

15. A method for manufacturing a semiconductor device, comprising:
forming a first stacked transistor device in a first region corresponding to a first type, wherein the first stacked transistor device comprises a first plurality of work function metal layers;
forming a second stacked transistor device spaced apart from the first stacked transistor device in a second region corresponding to a second type, wherein the second stacked transistor device comprises a second plurality of work function metal layers, and wherein a work function metal layer extends from the first and second plurality of work function metal layers to a space between the first and second stacked transistor devices;
depositing a mask layer to cover the second stacked transistor device and portions adjacent the second stacked transistor device in the second region;
removing part of the work function metal layer from the space between the first and second stacked transistor devices;
replacing the removed part of the work function metal layer with a polymer brush layer; and
selectively removing the first plurality of work function metal layers with respect to the polymer brush layer from the first region.

16. A method for manufacturing a semiconductor device, comprising:
forming a first plurality of stacked channel portions in a first region corresponding to a first type, wherein the first plurality of stacked channel portions are alternatingly stacked with a first plurality of work function metal layers;
forming a second plurality of stacked channel portions spaced apart from the first plurality of stacked channel portions in a second region corresponding to a second type, wherein the second plurality of stacked channel portions are alternatingly stacked with a second plurality of work function metal layers, and a work function metal layer extends from the first and second plurality of work function metal layers to a space between the first and second plurality of stacked channel portions;
forming an organic planarization layer in the second region covering the second plurality of stacked channel portions and covering a first part of the work function metal layer in the space between the first and second plurality of stacked channel portions;
removing a second part of the work function metal layer not covered by the organic planarization layer from the space between the first and second plurality of stacked channel portions;
removing a portion of the first part of the work function metal layer under the organic planarization layer;
replacing removed areas of the work function metal layer with a polymer brush layer; and
selectively removing the first plurality of work function metal layers with respect to the polymer brush layer from the first region.

17. The method according to claim 16, further comprising:
forming a first spacer layer on the first plurality of work function metal layers; and
forming a second spacer layer on the organic planarization layer.

18. The method according to claim 17, wherein a portion of the second part of the work function metal layer is removed from under the second spacer layer.

19. The method according to claim 17, wherein a high-k dielectric layer is formed under the work function metal layer.

20. The method according to claim 19, wherein replacing the removed areas of the work function metal layer with the polymer brush layer comprises selectively forming the polymer brush layer on the high-k dielectric layer.

* * * * *